US007812297B2

(12) United States Patent
Blaut et al.

(10) Patent No.: US 7,812,297 B2
(45) Date of Patent: Oct. 12, 2010

(54) INTEGRATED SYNCHRONIZED OPTICAL SAMPLING AND CONTROL ELEMENT

(75) Inventors: Roni Blaut, Netanya (IL); Alon Ferentz, Bat Yam (IL); Arkadiy Peker, New Hyde Park, NY (US); Dror Korcharz, Bat Yam (IL); Migel Jacubovski, Hod Hasharon (IL)

(73) Assignee: Microsemi Corp. - Analog Mixed Signal Group, Ltd., Hod Hasharon (IL)

( * ) Notice: Subject to any disclaimer, the term of this patent is extended or adjusted under 35 U.S.C. 154(b) by 228 days.

(21) Appl. No.: 12/136,095

(22) Filed: Jun. 10, 2008

(65) Prior Publication Data

US 2009/0001253 A1 Jan. 1, 2009

Related U.S. Application Data

(60) Provisional application No. 60/946,147, filed on Jun. 26, 2007, provisional application No. 60/954,338, filed on Aug. 7, 2007.

(51) Int. Cl.
*G01J 1/32* (2006.01)
*H03F 3/08* (2006.01)

(52) U.S. Cl. .................................. 250/205; 250/214 R

(58) Field of Classification Search ................. 250/205, 250/214 AL, 208.1, 214 R, 226; 315/219, 315/185 S, 224, 149, 155, 246, 247, 291, 315/294, 185 R; 345/204–215, 690–699, 345/87–88, 99, 102, 83–84; 362/227, 612, 362/800

See application file for complete search history.

(56) References Cited

U.S. PATENT DOCUMENTS 4,064,530 A 12/1977 Kaiser et al.
4,695,885 A 9/1987 Kim
5,387,921 A 2/1995 Zhang et al.
5,717,978 A 2/1998 Mestha
6,127,783 A 10/2000 Pashley et al.
6,194,839 B1 2/2001 Chang
6,201,353 B1 3/2001 Chang et al.
6,373,964 B1 4/2002 Geissler et al.
6,411,046 B1 6/2002 Muthu
6,441,558 B1 8/2002 Muthu (Continued)

FOREIGN PATENT DOCUMENTS

WO 2004084170 A1 9/2004
WO 2005111976 A1 11/2005
WO 2006005033 A2 1/2006
WO 2006070323 A1 7/2006
WO PCT/IL2008/000788 9/2008

OTHER PUBLICATIONS

Perduijn et al; "Light Output Feedback Solution for RGB LED Backlight Application"; SID 00 Digest; 2000; pp. 1-3; The Society for Information Display, San Jose, California.

(Continued)

*Primary Examiner*—Que T Le
*Assistant Examiner*—Jennifer Bennett
(74) *Attorney, Agent, or Firm*—Simon Kahn

(57) ABSTRACT

An optical sampling and control element for use with a luminaire exhibiting a cycle and a frame, the optical sampling and control element being constituted of a color sensor in optical communication with the luminaire; and a sampler connected to the outputs of the color sensor, the sampler comprising an integrator arranged to integrate the outputs of the color sensor over a predetermined period less than the frame.

10 Claims, 5 Drawing Sheets

U.S. PATENT DOCUMENTS

| | | | | |
|---|---|---|---|---|
| 6,448,550 | B1 * | 9/2002 | Nishimura | 250/226 |
| 6,521,879 | B1 | 2/2003 | Rand et al. | |
| 6,576,881 | B2 | 6/2003 | Muthu | |
| 6,611,249 | B1 | 8/2003 | Evanicky et al. | |
| 6,624,847 | B1 | 9/2003 | Abdellatif | |
| 6,870,525 | B2 | 3/2005 | Kawabata et al. | |
| 6,894,442 | B1 | 5/2005 | Lim et al. | |
| 6,930,737 | B2 | 8/2005 | Weindorf et al. | |
| 7,001,059 | B2 | 2/2006 | Han et al. | |
| 7,176,438 | B2 | 2/2007 | Bamji et al. | |
| 7,255,462 | B2 | 8/2007 | Tseng | |
| 7,315,288 | B2 | 1/2008 | Livingston et al. | |
| 7,348,949 | B2 | 3/2008 | Lee et al. | |
| 7,573,210 | B2 * | 8/2009 | Ashdown et al. | 315/307 |
| 2001/0035853 | A1 | 11/2001 | Hoelen et al. | |
| 2004/0135522 | A1 | 7/2004 | Berman et al. | |
| 2005/0212459 | A1 | 9/2005 | Patel et al. | |
| 2005/0231127 | A1 | 10/2005 | Yamamoto et al. | |
| 2005/0231459 | A1 | 10/2005 | Furukawa | |
| 2006/0038769 | A1 | 2/2006 | Marra et al. | |
| 2006/0050529 | A1 | 3/2006 | Chou et al. | |
| 2006/0108933 | A1 | 5/2006 | Chen | |
| 2006/0132423 | A1 | 6/2006 | Travis | |
| 2006/0187181 | A1 | 8/2006 | Kim | |
| 2006/0221047 | A1 | 10/2006 | Tanizoe et al. | |
| 2006/0244508 | A1 | 11/2006 | Zheng et al. | |
| 2007/0046485 | A1 | 3/2007 | Grootes et al. | |
| 2007/0063961 | A1 | 3/2007 | Kuroki | |
| 2007/0115228 | A1 | 5/2007 | Roberts et al. | |
| 2007/0182701 | A1 | 8/2007 | Kim et al. | |
| 2008/0018267 | A1 | 1/2008 | Arakawa et al. | |
| 2008/0204382 | A1 * | 8/2008 | Lim et al. | 345/83 |
| 2009/0189530 | A1 * | 7/2009 | Ashdown et al. | 315/152 |

OTHER PUBLICATIONS

Perduijn et al; "Light Output Feedback Solution for RGB LED Backlight Application"; SID 03 Digest; 2003; pp. 1254-1256; The Society for Information Display, San Jose, California.

Chen et al; "LED Back-Light Driving System for LCD Panels"; Applied Power Electronics Conference and Exposition; Published Mar. 19-23, 2006; IEEE New York.

Li, Perry Y. and Dianat, Sohail A.; "Robust Stabilization of Tone Reproduction Curves for the Xerographic Printing Process"; IEEE Transaction on Control Systems Technology, vol. 9, No. 2, Mar. 2001; pp. 407-415; published IEEE, New York.

Li, Perry Y. and Dianat, Sohail A., "Robust Stabilization of Tone Reproduction Curves for the Xerographic Printing Process"; 1998 IEEE Conference on Control Applications; Sept., Trieste , 1998; published IEEE, New York.

* cited by examiner

Fig. 7
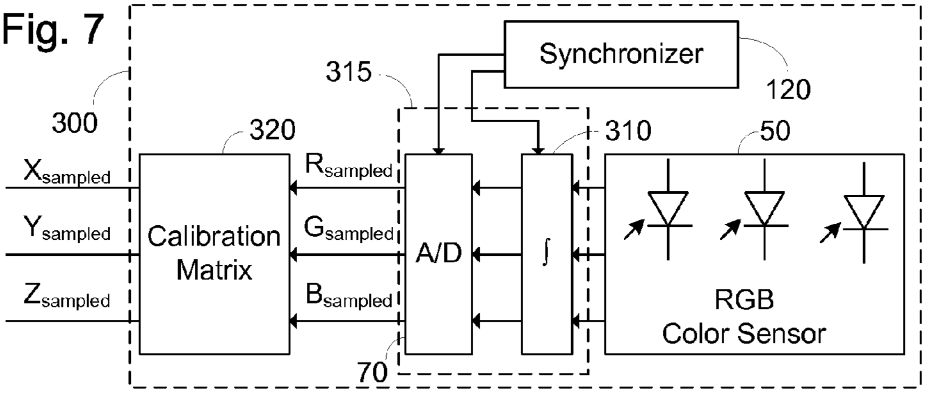
Fig. 8
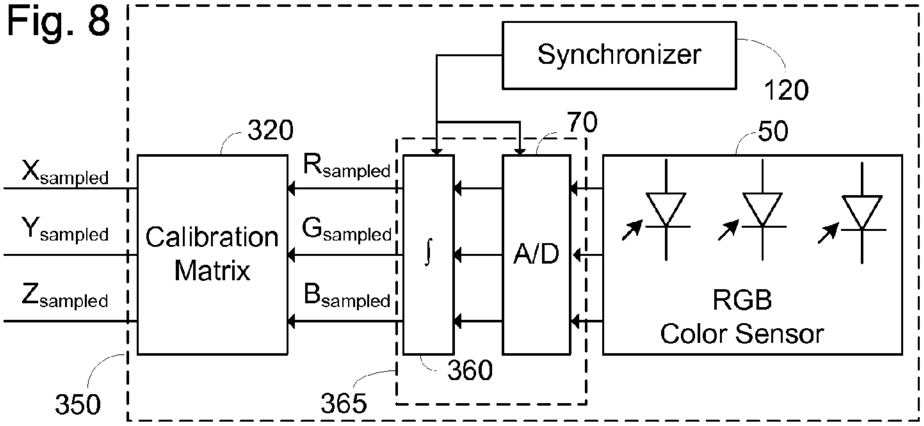
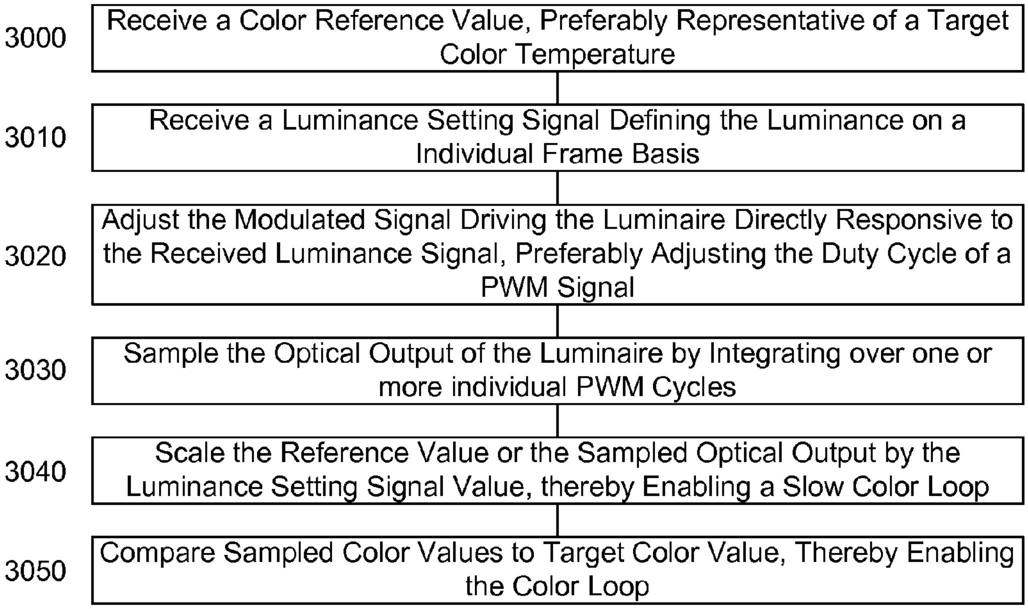
Fig. 9

INTEGRATED SYNCHRONIZED OPTICAL SAMPLING AND CONTROL ELEMENT

CROSS-REFERENCE TO RELATED APPLICATIONS

This application claims priority to U.S. Provisional Patent Application Ser. No. 60/946,147 filed Jun. 26, 2007 entitled "Brightness Control for Dynamic Scanning Backlight" and U.S. Provisional Patent Application Ser. No. 60/954,338 filed Aug. 7, 2008 entitled "Optical Sampling and Control Element", the contents of both of which are incorporated herein by reference. This application is further related to co-filed U.S. patent application entitled "Brightness Control for Dynamic Scanning Backlight", the entire contents of which is incorporated herein by reference.

BACKGROUND

The present invention relates to the field of light emitting diode based lighting and more particularly to an optical sampling and control element comprising an integrator.

Light emitting diodes (LEDs) and in particular high intensity and medium intensity LED strings are rapidly coming into wide use for lighting applications. LEDs with an overall high luminance are useful in a number of applications including backlighting for liquid crystal display (LCD) based monitors and televisions, collectively hereinafter referred to as a matrix display. In a large LCD matrix display typically the LEDs are supplied in one or more strings of serially connected LEDs, thus sharing a common current. Matrix displays typically display the image as a series of frames, with the information for the display being drawn from left to right in a series of descending lines during the frame.

In order supply a white backlight for the matrix display one of two basic techniques are commonly used. In a first technique one or more strings of "white" LEDs are utilized, the white LEDs typically comprising a blue LED with a phosphor which absorbs the blue light emitted by the LED and emits a white light. In a second technique one or more individual strings of colored LEDs are placed in proximity so that in combination their light is seen a white light. Often, two strings of green LEDs are utilized to balance one string each of red and blue LEDs.

In either of the two techniques, the strings of LEDs are in one embodiment located at one end or one side of the matrix display, the light being diffused to appear behind the LCD by a diffuser. In another embodiment the LEDs are located directly behind the LCD, the light being diffused so as to avoid hot spots by a diffuser. In the case of colored LEDs, a further mixer is required, which may be part of the diffuser, to ensure that the light of the colored LEDs is not viewed separately, but rather mixed to give a white light. The white point of the light is an important factor to control, and much effort in design in manufacturing is centered on the need to maintain a correct white point.

Each of the colored LED strings is typically intensity controlled by both amplitude modulation (AM) and pulse width modulation (PWM) to achieve an overall fixed perceived luminance. AM is typically used to set the white point produced by the disparate colored LED strings by setting the constant current flow through the LED string to a value achieved as part of a white point calibration process and PWM is typically used to variably control the overall luminance, or brightness, of the monitor without affecting the white point balance. Thus the current, when pulsed on, is held constant to maintain the white point among the disparate colored LED strings, and the PWM duty cycle is controlled to dim or brighten the backlight by adjusting the average current over time. The PWM duty cycle of each color is further modified to maintain the white point, preferably responsive to a color sensor, such as an RGB color sensor. The color sensor, arranged to output a tristimulus output, is arranged to receive the mixed white light, and thus a color control feedback loop may be maintained. The term tristimulus as used herein is meant to mean of, or consisting of, three stimuli, typically used to represent a correlated color temperature. There is no requirement that a color sensor output a tristimulus output corresponding to a particular standard. It is to be noted that different colored LEDs age, or reduce their luminance as a function of current, at different rates and thus the PWM duty cycle of each color must be modified over time to maintain the white point set by AM. The colored LEDs also change their output as a function of temperature, which must be further corrected for by adjusting the respective PWM duty cycles to achieve the desired white point.

One known problem of LCD matrix displays is motion blur. One cause of motion blur is that the response time of the LCD is finite. Thus, there is a delay from the time of writing to the LCD pixel until the image changes. Furthermore, since each pixel is written once per scan, and is then held until the next scan, smooth motion is not possible. The eye notices the image being in the wrong place until the next sample, and interprets this as blur or smear.

This problem is addressed by a scanning backlight, in which the matrix display is divided into a plurality of regions, or zones, and the backlight for each zone is illuminated for a short period of time in synchronization with the writing of the image. Ideally, the backlighting for the zone is illuminated just after the pixel response time, and the illumination is held for a predetermined illumination frame time whose timing is associated with the particular zone.

An additional known problem of LCD matrix displays is the lack of contrast, in particular in the presence of ambient light. An LCD matrix display operates by providing two linear polarizers whose orientation in relation to each other is adjustable. If the linear polarizers are oriented orthogonally to each other, light from the backlight is prevented from being transmitted in the direction of the viewer. If the linear polarizers are aligned, the maximum amount of light is transmitted in the direction of the viewer. Unfortunately, a certain amount of light leakage occurs when the polarizers are oriented orthogonally to each other, thus reducing the overall contrast.

This problem is addressed by adding dynamic capability to the scanning backlight, the dynamic capability adjusting the overall luminance of the backlight for each zone responsive to the current video signal, typically calculated by a video processor. Thus, in the event of a dark scene, the backlight luminance is reduced thereby improving the contrast. Since the luminance of a scene may change on a frame by frame basis, the luminance is preferably set on a frame by frame basis, responsive to the video processor. It is to be noted that a new frame begins every 16.7-20 milliseconds, depending on the system used.

An article by Perduijn et al, entitled "Light Output Feedback Solution for RGB LED Backlight Applications, published as part of the SID 03 Digest, by the Society for Information Display, San Jose, Calif., ISSN/0003-0996X)3/3403-1254, the entire contents of which is incorporated herein by reference, is addressed to a backlighting system utilizing RGB LED light sources, a color sensor and a feedback controller operative to maintain a color stability over temperature, denoted $\Delta u'v'$, of less than 0.002. Optionally brightness can be maintained at a constant level. Brightness, or luminance, control is accomplished by comparing the luminance sensed output of the LEDs with a luminance set point. The difference is fed to adjust the color set point, and the loop is closed via the color control loop. Unfortunately, in the instance of a dynamic backlight as described above, use of the color control loop to control luminance requires a high speed color loop, because the luminance may change from frame to frame. Such a high speed color loop adds to cost.

U.S. Patent Application Publication Ser. No. 2006/0221047 A1 in the name of Tanizoe et al, published Oct. 5, 2006 and entitled "Liquid Crystal Display Device", the entire contents of which is incorporated herein by reference, is addressed to a liquid crystal display device capable of shortening the time required for stabilizing the brightness and chromaticity to temperature change. A brightness setting means is multiplied with a color setting means prior to feedback to a comparison means, and thus a single feedback loop controls both brightness and color. Unfortunately, in the instance of dynamic backlight, use of the color control loop to control luminance requires a high speed color loop, because the luminance may change from frame to frame, thus adding to cost.

World Intellectual Property Organization Publication Ser. No. WO 2006/005033 published Jan. 12, 2006 to Nuelight Corporation, entitled "System and Method for a High Performance Display Device Having Individual Pixel Luminance Sensing and Control", the entire contents of which is incorporated herein by reference, teaches integrating the number of photons from an emissive device over a defined period, typically a frame. The above publication does not teach or describe the implementation of such a technology with a PWM controlled LED lighting source being lit for a portion of a frame, as described above in relation to dynamic backlighting, nor does it teach or describe implementation of digital integrator with a sampling rate lower than required for complete discrimination of a single PWM cycle.

What is needed, and not provided by the prior art, are elements for a feedback color loop of a PWM controlled light source, known as a luminaire, whose target value luminance may be changed on a frame to frame basis.

SUMMARY

Accordingly, it is a principal object to overcome at least some of the disadvantages of prior art. This is provided in certain embodiments by an optical sampling and control element in which a portion of the light from a luminaire is received at a color sensor, which outputs electrical signals responsive to particular ranges of wavelengths of the received light. The outputs of the color sensor are integrated over a predetermined period. In one embodiment the outputs of the color sensor are integrated over each active PWM cycle of the luminaire. In another embodiment the outputs of the color sensor are integrated over a plurality of active PWM cycles of the luminaire.

In one embodiment the integrator is an analog integrator, whose output is digitized by an analog to digital converter. In another embodiment the integrator is a digital integrator arranged to integrate digitized samples of the color sensor outputs. In one further embodiment, the digitizer is arranged to digitize samples of adjacent cycles of the source luminaire at an offset, thus resulting in an effective increase in sampling rate. The digitized samples are summed and normalized to the required accuracy.

In certain embodiments an optical sampling and control element is provided comprising: a color sensor; and a sampler connected to the outputs of the color sensor, the sampler comprising an integrator arranged to integrate the outputs of the color sensor over a predetermined period less than a frame time.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIG. 7 illustrates a high level block diagram of an embodiment of an sampler in accordance with a principle of the current invention, in which the output of the color sensor is integrated prior to sampling and digitizing;

FIG. 8 illustrates a high level block diagram of an embodiment of an sampler in accordance with a principle of the current invention, in which the output of the color sensor is sampled, digitizing and then integrated;

FIG. 9 illustrates a high level flow chart of a method according to a principle of the invention to enable color control by a slow color loop and per frame luminance control in cooperation with the embodiments of FIG. 2 or FIG. 3 utilizing the sampler of FIG. 7 or FIG. 8.

DETAILED DESCRIPTION

Figure 1:
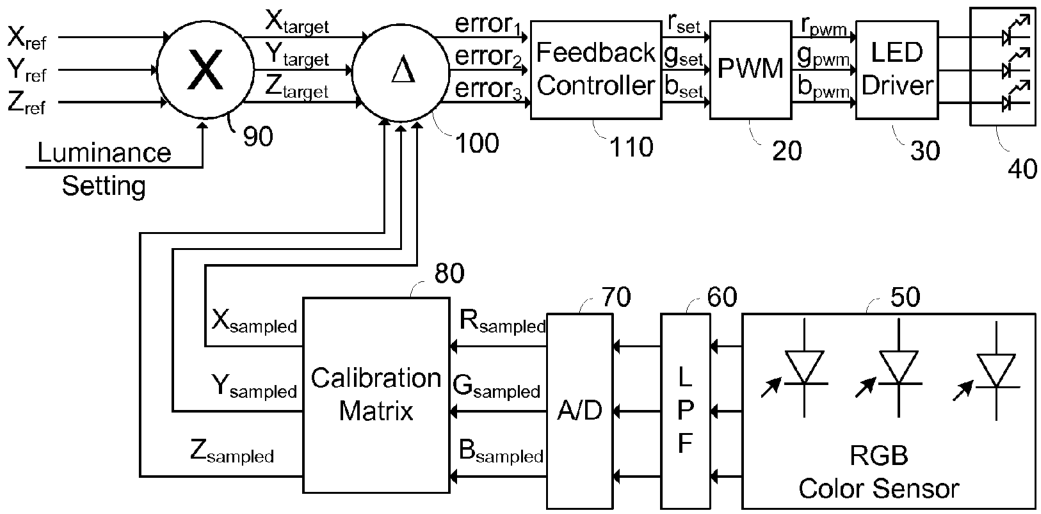
Fig. 1 Prior Art
FIG. 1 illustrates a high level block diagram of a color control loop for LED backlighting in accordance with the prior art.

Some of the present embodiments enable an optical sampling and control element in which a portion of the light from a luminaire is received at a color sensor, which outputs electrical signals responsive to particular ranges of wavelengths of the received light. The outputs of the color sensor are integrated over a predetermined period. In one embodiment the outputs of the color sensor are integrated over each active PWM cycle of the luminaire. In another embodiment the outputs of the color sensor are integrated over a plurality of active PWM cycles of the luminaire.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1 illustrates a high level block diagram of a color control loop for LED backlighting in accordance with the prior art comprising: a PWM generator 20; an LED driver 30; a plurality of LED strings 40 comprising red, blue and green LED strings and constituting a luminaire; an RGB color sensor 50 exhibiting a tristimulus output; a low pass filter 60; an analog to digital (A/D) converter 70; a calibration matrix 80; a scaler 90; a difference generator 100; and a feedback controller 110.

PWM generator 20 is arranged to output a PWM red LED signal denoted $r_{pwm}$, a PWM green LED signal denoted $g_{pwm}$, and a PWM blue LED signal denoted $b_{pwm}$. LED driver 30 is arranged to receive $r_{pwm}$, $g_{pwm}$ and $b_{pwm}$ and drive the respective red, blue and green plurality of LED strings 40 responsive to the respective received $r_{pwm}$, $g_{pwm}$ and $b_{pwm}$ signal. RGB color sensor 50 is in optical communication with the output of the plurality of LED strings 40 and is operative to output a plurality of signals responsive to the output LED strings 40. Low pass filter 60 is arranged to received the output of RGB color sensor 50 and reduce any noise thereof by only passing low frequency signals. A/D converter 70 is arranged to receive the output of low pass filter 60 and output a plurality of sampled and digitized signals thereof denoted respectively, $R_{sampled}$, $G_{sampled}$ and $B_{sampled}$. Calibration matrix 80 is arranged to receive $R_{sampled}$, $G_{sampled}$ and $B_{sampled}$ and output a plurality of calibration converted sampled signals denoted respectively $X_{sampled}$, $Y_{sampled}$ and $Z_{sampled}$. Calibration matrix 80 converts $R_{sampled}$, $G_{sampled}$ and $B_{sampled}$ to a calorimetric system consonant with calorimetric system of the received color target reference signals described further below. The above has been described in relation to the CIE 1931 color space, however this is not meant to be limiting in any way. Use of other color spaces, including but not limited to the CIE LUV color space, and the CIE LAB color space are specifically incorporated herewith.

Scaler 90, illustrated as a multiplier, is arranged to receive a luminance setting input, which in one embodiment comprises a dimming signal or a boosting signal, and a plurality of color target reference signals denoted respectively $X_{ref}$, $Y_{ref}$, $Z_{ref}$, and output a plurality of luminance scaled color target reference signals denoted respectively $X_{target}$, $Y_{target}$ and $Z_{target}$. The luminance scaled color target reference signals $X_{target}$, $Y_{target}$ and $Z_{target}$ represent $X_{ref}$, $Y_{ref}$, $Z_{ref}$ multiplied by the dimming factor of the luminance setting input signal. Alternatively, in the event a boosting signal is received, the luminance scaled color target reference signals $X_{target}$, $Y_{target}$ and $Z_{target}$ represent $X_{ref}$, $Y_{ref}$, $Z_{ref}$ scaled by the boosting value of the luminance setting input signal. Difference generator 100 is arranged to receive the sets of $X_{target}$, $Y_{target}$ and $Z_{target}$ and $X_{sampled}$, $Y_{sampled}$ and $Z_{sampled}$ and output a plurality of error signals denoted respectively $error_1$ $error_2$ and $error_3$ reflective of any difference thereof. Feedback controller 110 is arranged to receive $error_1 error_2$ and $error_3$ and output a plurality of PWM control signals denoted respectively $r_{set}$, $g_{set}$ and $b_{set}$ which are operative to control the duty cycle of the respective PWM signals of PWM generator 20. PWM generator 20 is arranged to receive $r_{set}$, $g_{set}$ and $b_{set}$ and as described above output $r_{pwm}$, $g_{pwm}$ and $b_{pwm}$ responsive thereto. LED strings 40 may be replaced with individual red, green and blue LEDs, or modules comprising individual red, green and blue LEDs, without exceeding the scope of the invention.

In operation, a host system, or a non-volatile memory set at an initial calibration, outputs $X_{ref}$, $Y_{ref}$ and $Z_{ref}$, thereby setting the desired white point, or other correlated color temperature, of LED strings 40. A luminance setting signal, preferably responsive to a user input, is operative to set the desired overall luminance by adjusting $X_{ref}$, $Y_{ref}$ and $Z_{ref}$ by a dimming or boosting factor through scaler 90, thereby generating scaled color target reference signals $X_{target}$, $Y_{target}$ and $Z_{target}$. Feedback controller 110 is operative in cooperation with PWM generator 20, RGB color sensor 50 and calibration matrix 80 to close the color loop thereby maintaining the light output by LED strings 40 consonant with scaled color target reference signals $X_{target}$, $Y_{target}$ and $Z_{target}$. Feedback controller 110 is typically implemented as a proportional integral derivative (PID) controller requiring a plurality of steps to settle at the revised value. Thus any change to the luminance setting input, which affects the luminance by way of the color loop, requires multiple passes to fully stabilize. In the event of rapid changes in the luminance setting input, and in particular in the event of a dynamic backlight as described above, consistent adjustment of the overall luminance responsive to the luminance setting input is not achieved on a per frame basis, unless an extremely high speed color loop is implemented, thereby adding to cost.

Figure 2:
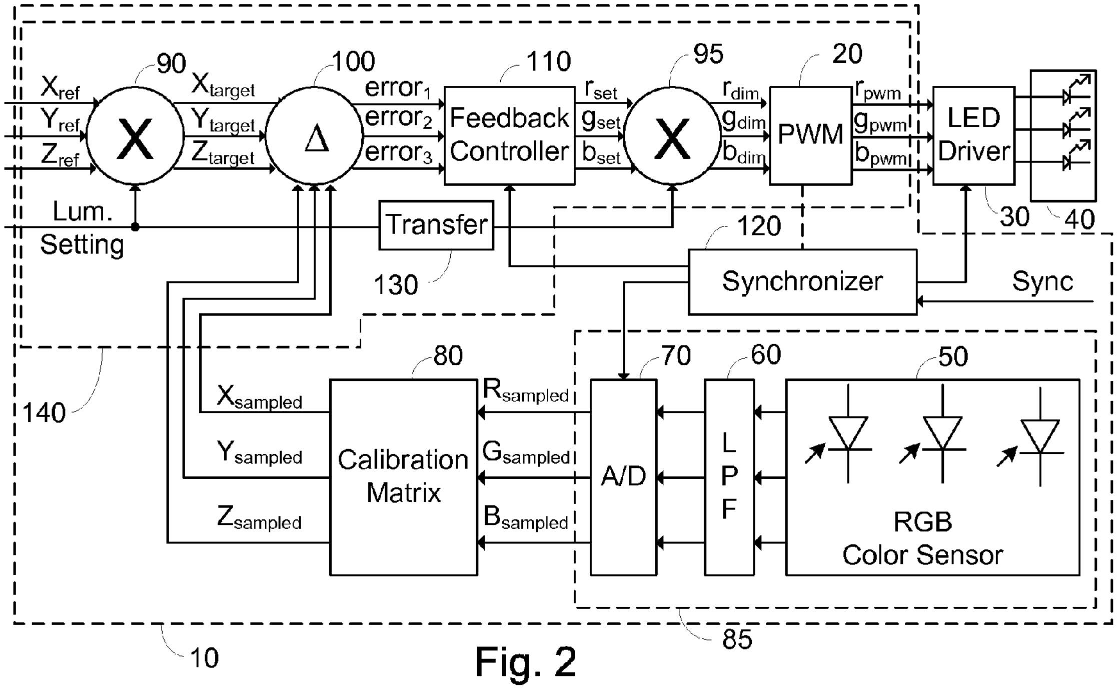
FIG. 2 illustrates a high level block diagram of a first embodiment of a color control loop for LED backlighting exhibiting a direct luminance setting input in accordance with a principle of the current invention, in which the received reference values are scaled by the luminance setting input.

FIG. 2 illustrates a high level block diagram of a first embodiment of a color control loop for LED backlighting exhibiting a direct luminance setting input, in accordance with a principle of the current invention, in which the received reference values are scaled by the luminance setting input, the color control loop comprising: an LED driver 30; a plurality of LED strings 40 comprising red, blue and green LED strings and constituting a luminaire; an optical sampling and control element 85 comprising an RGB color sensor 50 exhibiting a tristimulus output, a low pass filter 60 and an A/D converter 70; a calibration matrix 80; a color manager 140 comprising a first scaler 90, a second scaler 95, a difference generator 100, a feedback controller 110, a PWM generator 20 and a transfer function converter 130; and a synchronizer 120. Optical sampling and control element 85 may optionally further comprise any or all of synchronizer 120, calibration matrix 80, all or part of color manager 140 and LED driver 30 without exceeding the scope of the invention. Optical sampling and control element 85, color manager 140, synchronizer 120 and calibration matrix 80 are optionally part of an integrated optical sampling, control and generator element 10.

PWM generator 20 is arranged to output a PWM red LED signal denoted $r_{pwm}$, a PWM green LED signal denoted $g_{pwm}$, and a PWM blue LED signal denoted $b_{pwm}$. LED driver 30 is arranged to receive $r_{pwm}$, $g_{pwm}$ and $b_{pwm}$ and drive the respective red, blue and green plurality of LED strings 40 responsive to the respective received $r_{pwm}$, $g_{pwm}$ and $b_{pwm}$. RGB color sensor 50 is in optical communication with the output of the plurality of LED strings 40 and is operative to output a plurality of signals responsive to the optical output of LED strings 40. Low pass filter 60 is arranged to received the output of RGB color sensor 50 and reduce any noise thereof by only passing low frequency signals. A/D converter 70 is arranged to receive the output of low pass filter 60 and output a plurality of sampled and digitized signals thereof denoted respectively, $R_{sampled}$, $G_{sampled}$ and $B_{sampled}$, the sampling and digitizing being responsive to synchronizer 120. Calibration matrix 80 is arranged to receive $R_{sampled}$, $G_{sampled}$ and $B_{sampled}$ and output a plurality of calibration converted sampled signals denoted respectively $X_{sampled}$, $Y_{sampled}$ and $Z_{sampled}$. Calibration matrix 80 converts $R_{sampled}$, $G_{sampled}$ and $B_{sampled}$ to a calorimetric system consonant with calorimetric system of the received color target reference signals described further below. The above has been described in relation to the CIE 1931 color space, however this is not meant to be limiting in any way. Use of other color spaces, including but not limited to the CIE LUV color space, and the CIE LAB color space are specifically incorporated herewith. Thus, optical sampling and control element 85 is in optical communication with the luminaire constituted of LED strings 40 and outputs a signal representative thereof consonant with received target reference signals.

First scaler 90, illustrated as a multiplier, is arranged to receive a luminance setting input, which in one embodiment comprises a dimming signal or a boosting signal, and a plurality of color target reference signals denoted respectively $X_{ref}$, $Y_{ref}$, $Z_{ref}$, and output a plurality of luminance scaled color target reference signals denoted respectively $X_{target}$, $Y_{target}$ and $Z_{target}$. The luminance scaled color target reference signals $X_{target}$, $Y_{target}$ and $Z_{target}$ represent $X_{ref}$, $Y_{ref}$, $Z_{ref}$ multiplied by the value of the luminance setting input signal. Alternatively, in the event a boosting signal is received, the luminance scaled color target reference signals $X_{target}$, $Y_{target}$ and $Z_{target}$ represent $X_{ref}$, $Y_{ref}$, $Z_{ref}$ scaled by the boosting value of the luminance setting input signal. The luminance setting input may be received as an analog signal or a digital signal without exceeding the scope of the invention.

Difference generator 100 is arranged to receive the sets of $X_{target}$, $Y_{target}$ and $Z_{target}$ and $X_{sampled}$, $Y_{sampled}$ and $Z_{sampled}$ and output a plurality of error signals denoted respectively $error_1 error_2$ and $error_3$ reflective of any difference thereof. Feedback controller 110 is arranged to receive $error_1 error_2$ and $error_3$ and output a plurality of PWM control signals denoted respectively $r_{set}$, $g_{set}$ and $b_{set}$ to control the duty cycle of the respective PWM signals of PWM generator 20. Second scaler 95, illustrated as a multiplier, directly receives the luminance setting input signal via transfer function converter 130, and $r_{set}$, $g_{set}$ and $b_{set}$ and in response outputs a scaled set of PWM control signals, denoted respectively $r_{dim}$, $g_{dim}$, and $b_{dim}$, the scaling reflecting the value of the luminance setting signal. PWM generator 20 is arranged to receive the scaled set of PWM control signals, $r_{dim}$, $g_{dim}$, $b_{dim}$ and output $r_{pwm}$, $g_{pwm}$ and $b_{pwm}$ responsive thereto, exhibiting the appropriate luminance setting. LED strings 40 may be replaced with individual red, green and blue LEDs, or modules comprising individual red, green and blue LEDs, without exceeding the scope of the invention.

Each of feedback controller 110, LED driver 30 and, as indicated above, A/D converter 70, receives a respective output of synchronizer 120. Feedback controller 110 is typically implemented as a PID controller requiring a plurality of steps to settle at the revised value. Synchronizer 120 is operative to: enable LED driver 30, responsive to a received Sync signal, during the appropriate portion of the frame; allow for propagation of the output of LED driver 30 through LED strings 40, RGB color sensor 50 and LPF 60 prior to sampling the output of LPF 60 by A/D converter 70; allow for settling of the output of A/D converter 70 with the sampled output of LPF 60, propagation through calibration matrix 80 and propagation through difference generator 100; and step feedback controller 110 with resultant sampled output of LED strings 40. Thus, synchronizer 120 controls A/D converter 70 and feedback controller 110 to ensure that the change in luminance of LED strings 40 responsive to the received luminance setting input at second scaler 95 impacts the input of feedback controller 110 prior to stepping feedback controller 110. Optionally, synchronizer 120 is further in communication with PWM generator 20 so as to be in synchronization with the cycle start time of $r_{pwm}$, $g_{pwm}$ and $b_{pwm}$.

Transfer function converter 130 is operative to compensate for any non-linearity in the response of LED strings 40 to a change in PWM setting. Thus, in the event of a purely linear response of luminance to a dimming or boosting factor, transfer function converter 130 acts as a pass through. In the event of any non-linearity, transfer function converter 130 acts to provide the PWM to luminance transfer function, which in one embodiment is stored in a look up table, and in another embodiment is implemented as a direct transfer function.

In operation, a host system, or a non-volatile memory, set at an initial calibration, outputs $X_{ref}$, $Y_{ref}$ and $Z_{ref}$, thereby setting the desired white point, or other correlated color temperature, and base luminance, of LED strings 40. A luminance setting signal, preferably responsive to a video processor on a frame by frame basis, is operative to set the overall luminance on a frame by frame basis without affecting the desired white point or other correlated color temperature setting by directly inputting the luminance setting input through second scaler 95, thereby generating scaled PWM control signals $r_{dim}$, $g_{dim}$, $b_{dim}$. The luminance setting input signal may be further responsive to a user input, preferably as an input to the video processor, or scaling the output of the video processor, without exceeding the scope of the invention. It is to be noted that the effect of the luminance setting signal is thus immediate, and is irrespective of the action of the slow acting color loop. The color loop is made impervious to the luminance setting signal value by further inputting the luminance setting signal to first scaler 90, thereby scaling color target reference signals $X_{ref}$, $Y_{ref}$ and $Z_{ref}$ to generate $X_{target}$, $Y_{target}$ and $Z_{target}$ consonant with the sampled values $X_{sampled}$, $Y_{sampled}$ and $Z_{sampled}$. Difference generator 100 compares $X_{target}$, $Y_{target}$ and $Z_{target}$ respectively with $X_{sampled}$, $Y_{sampled}$ and $Z_{sampled}$, and outputs error signals $error_1$, $error_2$ and $error_3$, reflective of the respective difference thereof. Feedback controller 110 is operative in cooperation with PWM generator 20 via second scaler 95, RGB color sensor 50 and calibration matrix 80 to close the color loop thereby maintaining the light output by LED strings 40 consonant with color target reference signals $X_{ref}$, $Y_{ref}$ and $Z_{ref}$. Synchronizer 120, as described above, acts to enable LED driver 30 during the appropriate portion of the frame, clock A/D converter 70 so as to sample the optical output during the active portion of the frame, and step feedback controller 110 responsive to the clocked sample optical output. Preferably, synchronizer 120 is in communication with PWM generator 20 to ensure synchronization with the PWM cycle generator therein.

In one embodiment, A/D converter 70 samples the optical output each PWM cycle of PWM controller 20 when LED driver 30 is enabled, responsive to synchronizer 120. Sampling only when LED driver 30 is enabled releases computing resources for use by other channels and reduces noise. In another embodiment, as will be described further hereinto below in relation to FIGS. 7-9, LPF 60 is replaced with an integrator arranged to present the overall energy of the PWM cycle to A/D converter 70.

It is to be understood that either, or both, of first scaler 90 and second scaler 95 may be implemented digitally, or in an analog fashion, and any analog to digital conversion required is specifically incorporated herein. Integrated optical sampling, control and generator element 10 thus provides a complete color manager and control system with a minimum of external components, while providing immediate response to luminance settings per frame.

Thus, the arrangement of FIG. 2 enables immediate luminance setting responsive to the luminance setting input signal, input via second scaler 95, without affecting the slow acting color loop. The slow acting color loop is held invariant in face of the changing luminance due to the scaling action of first scaler 90.

The above embodiment has been explained in reference to an embodiment in which LEDs 40 are driven by a PWM signal, whose duty cycle is controlled so as to accomplish both dimming or boosting and control of the color correlated temperature, however this is not meant to be limiting in any way. In another embodiment LEDs 40 are adjusted by one or more of a resonance controller and amplitude modulation to control at least one of dimming or boosting and the color correlated temperature without exceeding the scope of the invention.

Figure 3:
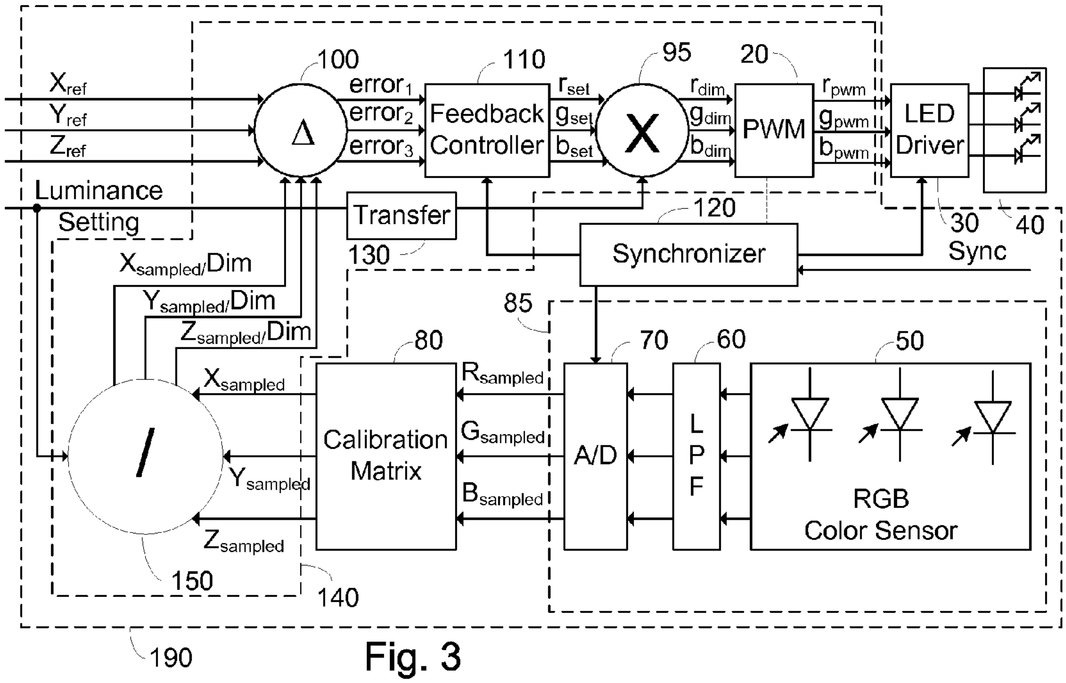
FIG. 3 illustrates a high level block diagram of a second embodiment of a color control loop for LED backlighting exhibiting a direct luminance setting input in accordance with a principle of the current invention, in which the sampled optical output is scaled by the luminance setting input.

FIG. 3 illustrates a high level block diagram of a second embodiment of a color control loop for LED backlighting exhibiting a direct luminance setting input, in accordance with a principle of the current invention, in which the sampled optical output is scaled by the luminance setting input, the color control loop comprising: an LED driver 30; a plurality of LED strings 40 comprising red, blue and green LED strings and constituting a luminaire; an optical sampling and control element 85 comprising an RGB color sensor 50 exhibiting a tristimulus output, a low pass filter 60 and an A/D converter 70; a calibration matrix 80; a color manager 140 comprising a first scaler 150, a second scaler 95, a difference generator 100, a feedback controller 110, a transfer function converter 130 and a PWM generator 20; and a synchronizer 120. Optical sampling and control element 85 may optionally further comprise any or all of synchronizer 120, calibration matrix 80, all or part of color manager 140 and LED driver 30 without exceeding the scope of the invention. Optical sampling and control element 85, color manager 140, synchronizer 120 and calibration matrix 80 are optionally part of an integrated optical sampling, control and generator element 190.

PWM generator 20 is arranged to output a PWM red LED signal denoted $r_{pwm}$, a PWM green LED signal denoted $g_{pwm}$, and a PWM blue LED signal denoted $b_{pwm}$. LED driver 30 is arranged to receive $r_{pwm}$, $g_{pwm}$ and $b_{pwm}$ and drive the respective red, blue and green plurality of LED strings 40 responsive to the respective received $r_{pwm}$, $g_{pwm}$ and $b_{pwm}$. RGB color sensor 50 is in optical communication with the output of the plurality of LED strings 40 and is operative to output a plurality of signals responsive to the optical output of LED strings 40. Low pass filter 60 is arranged to received the output of RGB color sensor 50 and reduce any noise thereof by only passing low frequency signals. A/D converter 70 is arranged to receive the output of low pass filter 60 and output a plurality of sampled and digitized signals thereof denoted respectively, $R_{sampled}$, $G_{sampled}$ and $B_{sampled}$, the sampling and digitizing being responsive to synchronizer 120. Calibration matrix 80 is arranged to receive $R_{sampled}$, $G_{sampled}$ and $B_{sampled}$ and output a plurality of calibration converted sampled signals denoted respectively $X_{sampled}$, $Y_{sampled}$ and $Z_{sampled}$. Calibration matrix 80 converts $R_{sampled}$, $G_{sampled}$ and $B_{sampled}$ to a calorimetric system consonant with calorimetric system of the received color target reference signals described further below. The above has been described in relation to the CIE 1931 color space, however this is not meant to be limiting in any way. Use of other color spaces, including but not limited to the CIE LUV color space, and the CIE LAB color space are specifically incorporated herewith. Thus, optical sampling and control element 85 is in optical communication with the luminaire constituted of LED strings 40 and outputs a signal representative thereof consonant with received target reference signals.

First scaler 150, illustrated as a divider, is arranged to receive a luminance setting input signal, expressed for simplicity as a percentage of full luminance, and the plurality of calibration converted sampled signals denoted respectively $X_{sampled}$, $Y_{sampled}$ and $Z_{sampled}$ and output a plurality of scaled calibrated converted sampled signals, denoted respectively $X_{sampled}$/Dim, $Y_{sampled}$/Dim and $Z_{sampled}$/Dim. Thus, the output of first scaler 150 represents the sampled light received by RGB sensor 50, sampled and calibrated by A/D converter 70 and calibration matrix 80, respectively, scaled up by the inverse of the dimming factor to be consonant with the input reference levels $X_{ref}$, $Y_{ref}$ and $Z_{ref}$, respectively. The above has been described in an embodiment in which the luminance setting input is received as a dimming signal, however this is not meant to be limiting in any way. In another embodiment the luminance setting input is received as a boost signal without exceeding the scope of the invention, and first scaler 150 acts as a multiplier. The luminance setting input may be received as an analog signal or a digital signal without exceeding the scope of the invention.

Difference generator 100 is arranged to receive a plurality of color target reference signals denoted respectively $X_{ref}$, $Y_{ref}$, $Z_{ref}$ and the set of $X_{sampled}$/Dim, $Y_{sampled}$/Dim and $Z_{sampled}$/Dim and output a plurality of error signals denoted respectively $error_1$, $error_2$ and $error_3$ reflective of any difference thereof. Feedback controller 110 is arranged to receive $error_1$, $error_2$ and $error_3$ and output a plurality of PWM control signals denoted respectively $r_{set}$, $g_{set}$ and $b_{set}$ to control the duty cycle of the respective PWM signals of PWM generator 20. Second scaler 95, illustrated as a multiplier, directly receives the luminance setting input signal via transfer function converter 130, and the outputs of feedback controller 110 $r_{set}$, $g_{set}$ and $b_{set}$ and in response outputs a scaled set of PWM control signals, denoted respectively, $r_{dim}$, $g_{dim}$, and $b_{dim}$, the scaling reflecting the value of the luminance setting signal. PWM generator 20 is arranged to receive the scaled set of PWM control signals, $r_{dim}$, $g_{dim}$, $b_{dim}$ and output $r_{pwm}$, $g_{pwm}$ and $b_{pwm}$ responsive thereto, exhibiting the appropriate color and luminance level. LED strings 40 may be replaced with individual red, green and blue LEDs, or modules comprising individual red, green and blue LEDs, without exceeding the scope of the invention.

Each of feedback controller 110, LED driver 30 and, as indicated above, A/D converter 70, receives a respective output of synchronizer 120. Feedback controller 110 is typically implemented as a PID controller requiring a plurality of steps to settle at the revised value. Synchronizer 120 is operative to: enable LED driver 30, responsive to a received Sync signal, during the appropriate portion of the frame; allow for propagation of the output of LED driver 30 through LED strings 40, RGB color sensor 50 and LPF 60 prior to sampling the output of LPF 60 by A/D converter 70; allow for settling of the output of A/D converter 70 with the sampled output of LPF 60, propagation through calibration matrix 80 and propagation through first scaler 150 and difference generator 100; and step feedback controller 110 with resultant sampled output of LED strings 40. Thus, synchronizer 120 controls A/D converter 70 and feedback controller 110 to ensure that the change in luminance of LED strings 40 responsive to the received luminance setting input at second scaler 95 impacts the input of feedback controller 110 prior to stepping feedback controller 110. Optionally, synchronizer 120 is further in communication with PWM generator 20 so as to be in synchronization with the cycle start time of $r_{pwm}$, $g_{pwm}$ and $b_{pwm}$.

Transfer function converter 130 is operative to compensate for any non-linearity in the response of LED strings 40 to a change in PWM setting. Thus, in the event of a purely linear response of luminance to a dimming or boosting factor, transfer function converter 130 acts as a pass through. In the event of any non-linearity, transfer function converter 130 acts to provide the PWM to luminance transfer function, which in one embodiment is stored in a look up table, and in another embodiment is implemented as a direct transfer function.

In operation, a host system, or a non-volatile memory, set at an initial calibration, outputs $X_{ref}$, $Y_{ref}$ and $Z_{ref}$, thereby setting the desired white point, or other correlated color temperature, and base luminance of LED strings 40. A luminance setting input signal, preferably responsive to a video processor on a frame by frame basis, is operative to set the overall luminance on a frame by frame basis without affecting the desired white point or other correlated color temperature setting by directly inputting the luminance setting input through second scaler 95, thereby generating scaled PWM control signals $r_{dim}$, $g_{dim}$, $b_{dim}$. The luminance setting input signal may be further responsive to a user input, preferably as an input to the video processor, or scaling the output of the video processor, without exceeding the scope of the invention. It is to be noted that the effect of the luminance setting signal is thus immediate, and is irrespective of the action of the slow acting color loop. The color loop is made impervious to the luminance setting signal value by further inputting the luminance setting signal to first scaler 150, thereby scaling calibrated converted sampled signals $X_{sampled}$, $Y_{sampled}$ and $Z_{sampled}$ to $X_{sampled}$/Dim, $Y_{sampled}$/Dim and $Z_{sampled}$/Dim consonant with the received $X_{ref}$, $Y_{ref}$ and $Z_{ref}$, respectively. Difference generator 100 compares $X_{ref}$, $Y_{ref}$ and $Z_{ref}$ respectively with $X_{sampled}$/Dim, $Y_{sampled}$/Dim and $Z_{sampled}$/Dim, and outputs error signals $error_1$ $error_2$ and $error_3$, reflective of the respective difference thereof. Feedback controller 110 is operative in cooperation with PWM generator 20 via second scaler 95, RGB color sensor 50 and calibration matrix 80 to close the color loop thereby maintaining the light output by LED strings 40 consonant with color target reference signals $X_{ref}$, $Y_{ref}$ and $Z_{ref}$. Synchronizer 120, as described above, acts to enable LED driver 30 during the appropriate portion of the frame, clock A/D converter 70 so as to sample the optical output during the active portion of the frame, and step feedback controller 110 responsive to the clocked sample optical output. Preferably, synchronizer 120 is in communication with PWM generator 20 to ensure synchronization with the PWM cycle generator therein.

In one embodiment, A/D converter 70 samples the optical output each PWM cycle of PWM controller 20 when LED driver 30 is enabled, responsive to synchronizer 120. Sampling only when LED driver 30 is enabled releases computing resources for use by other channels and reduces noise. In another embodiment, as will be described further hereinto below in relation to FIGS. 7-9, LPF 60 is replaced with an integrator arranged to present the overall energy of the PWM cycle to A/D converter 70.

It is to be understood that either, or both, of first scaler 150 and second scaler 95 may be implemented digitally, or in an analog fashion, and any analog to digital conversion required is specifically incorporated herein. Integrated optical sampling, control and generator element 190 thus provides a complete color manager and control system with a minimum of external components, while providing immediate response to luminance settings per frame.

Thus, the arrangement of FIG. 3 enables immediate luminance setting responsive to the luminance setting input signal, input via second scaler 95, without affecting the slow acting color loop. The slow acting color loop is held invariant in face of the changing luminance due to the scaling action of first scaler 150.

The above embodiment has been explained in reference to an embodiment in which LEDs 40 are driven by a PWM signal, whose duty cycle is controlled so as to accomplish both dimming or boosting and control of the color correlated temperature, however this is not meant to be limiting in any way. In another embodiment LEDs 40 are adjusted by one or more of a resonance controller and amplitude modulation to control at least one of dimming or boosting and the color correlated temperature without exceeding the scope of the invention.

Figure 4:
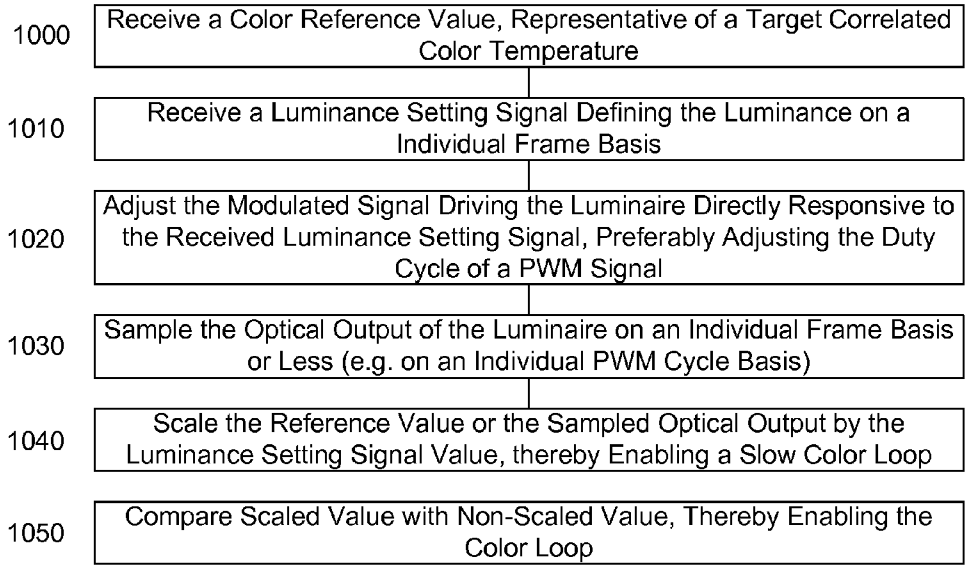
FIG. 4 illustrates a high level flow chart of a method according to a principle of the invention to enable color control by a slow color loop and per frame luminance control in cooperation with the embodiments of FIG. 2 or FIG. 3.

FIG. 4 illustrates a high level flow chart of a method according to a principle of the invention to enable color control by a slow color loop and immediate per frame luminance control in cooperation with the embodiment of FIG. 2 or FIG. 3. In stage 1000, a color reference value is received, the received color reference value being representative of a target color correlated temperature and base luminance. In one embodiment the received reference value represents a white point.

In stage 1010, a luminance setting input signal is received, the received luminance setting signal defining the desired luminance of the backlight, or a particular zone of the backlight, on an individual frame basis. The luminance setting signal may be a dimming signal or a boosting signal without exceeding the scope of the invention. Thus, the reference value of stage 1000 is invariant between frames, while the luminance setting signal of stage 1010 is variable on a frame by frame basis. There is no requirement that the luminance setting signal of stage 1010 be varied for each frame, and a plurality of contiguous frames exhibiting an unchanged luminance setting may be exhibited without exceeding the scope of the invention. There is no requirement that that reference values of stage 1000 be permanently fixed, and changes to the reference values of stage 1000 may occur, albeit preferably not on a frame by frame basis, without exceeding the scope of the invention.

In stage 1020, the modulated signal driving a luminaire is adjusted directly responsive to the received luminance setting signal of stage 1010. The term directly responsive as used herein, is meant to indicate that the luminance of the luminaire is adjusted responsive to the changed luminance setting signal as opposed to luminance change occurring primarily through action of the slow color loop as described in relation to FIG. 1 above. Preferably, the modulated signal is a PWM signal, and the adjustment of the modulated signal comprises adjusting the duty cycle of at least one PWM signal driving LEDs 40.

In stage 1030, the optical output of the luminaire driven by the modulated signal of stage 1020 is sampled on an individual frame basis, or less than an individual frame basis. In one embodiment, LPF 60 of FIGS. 2, 3 is designed so as to output an average luminance over a lighting portion of a frame, and synchronizer 120 is operative to sample the output of LPF 60 via A/D converter 70 so as to output a sample representative of the average luminance of the lighting portion of the frame. In another embodiment, A/D converter 70 samples the optical output each PWM cycle of PWM controller 20 when LED driver 30 is enabled, responsive to synchronizer 120. Preferably, in such an embodiment LPF 60 is replaced with an integrator arranged to present the overall energy of the PWM cycle to A/D converter 70.

In stage 1040, one of the sampled output of stage 1030 and the received reference of stage 1000 is scaled by the value of the received luminance setting signal of stage 1010 so as to be consonant with the other. The error signals output by difference generator 100 of FIGS. 2, 3 are thus independent of the luminance value set by the received luminance setting signal of stage 1010, and the slow color loop comprising feedback controller 110 is thus enabled irrespective of the changing luminance setting signal on a per frame basis. In stage 1050, the scaled value is compared with the non-scaled value, and a difference generated thereby enabling the slow color loop. In the event of an embodiment in accordance with the implementation of FIG. 2, the scaled reference value set is compared with non-scaled sampled set. In the event of an embodiment in accordance with the implementation of FIG. 3, the non-scaled reference value set is compared with scaled sampled set.

Figure 5:
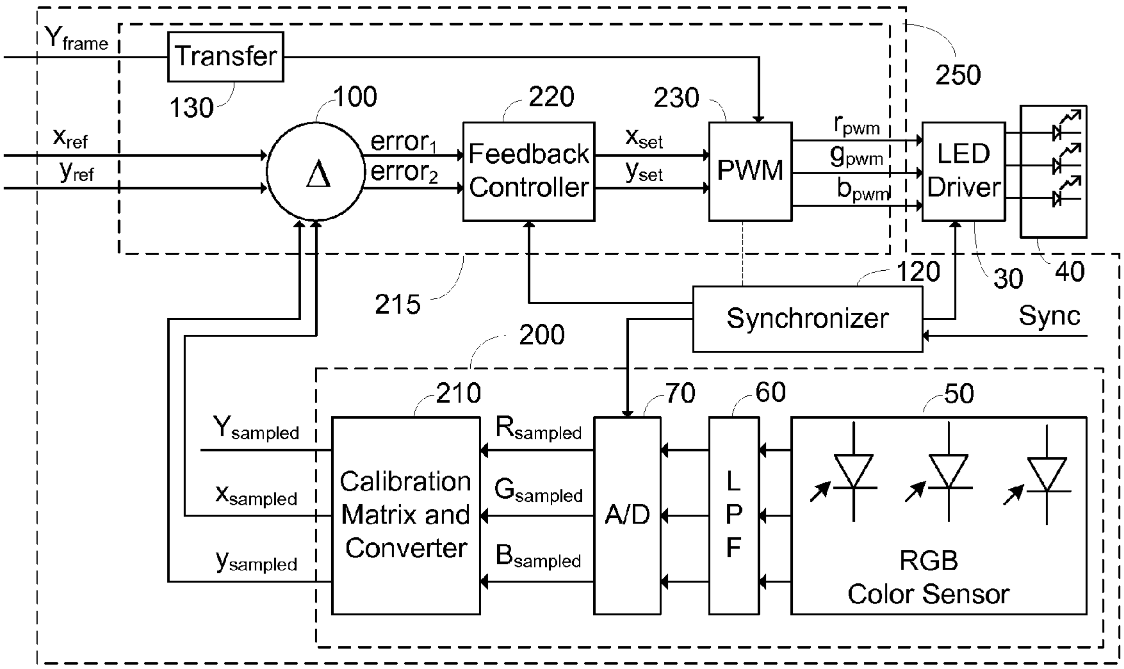
FIG. 5 illustrates a high level block diagram of a third embodiment of a color control loop for LED backlighting exhibiting a direct luminance setting input in accordance with a principle of the current invention, in which the luminance setting is removed from the color loop.

FIG. 5 illustrates a high level block diagram of a third embodiment of a color control loop for LED backlighting exhibiting a direct luminance setting input in accordance with a principle of the current invention, in which the luminance setting is removed from the color loop comprising: an LED driver 30; a plurality of LED strings 40 comprising red, blue and green LED strings and constituting a luminaire; an optical sampling and control element 200 comprising an RGB color sensor 50 exhibiting a tristimulus output, a low pass filter 60, an A/D converter 70 and a calibration matrix and converter 210; and a color manger 215 comprising a difference generator 100, a transfer function converter 130, a feedback controller 220 and a PWM generator 230; and a synchronizer 120. Optical sampling and control element 200 may optionally further comprise any or all of synchronizer 120, all or part of color manager 215 and LED driver 30 without exceeding the scope of the invention. Optical sampling and control element 200, color manager 215 and synchronizer 120 are optionally part of an integrated optical sampling, control and generator element 250.

PWM generator 230 is arranged to output a PWM red LED signal denoted $r_{pwm}$, a PWM green LED signal denoted $g_{pwm}$, and a PWM blue LED signal denoted $b_{pwm}$. LED driver 30 is arranged to receive $r_{pwm}$, $g_{pwm}$ and $b_{pwm}$ and drive the respective red, blue and green plurality of LED strings 40 responsive to the respective received $r_{pwm}$, $g_{pwm}$ and $b_{pwm}$. RGB color sensor 50 is in optical communication with the output of the plurality of LED strings 40 and is operative to output a plurality of signals responsive to the optical output of LED strings 40. Low pass filter 60 is arranged to received the output of RGB color sensor 50 and reduce any noise thereof by only passing low frequency signals. A/D converter 70 is arranged to receive the output of low pass filter 60 and output a plurality of sampled and digitized signals thereof denoted respectively, $R_{sampled}$, $G_{sampled}$ and $B_{sampled}$, the sampling and digitizing being responsive to synchronizer 120. Calibration matrix and converter 210 is arranged to receive $R_{sampled}$, $G_{sampled}$ and $B_{sampled}$ and output a plurality of calibration converted sampled signals denoted respectively $x_{sampled}$, $y_{sampled}$ and $Y_{sampled}$. Calibration matrix and converter 210 thus converts $R_{sampled}$, $G_{sampled}$ and $B_{sampled}$ to a calorimetric system consonant with calorimetric system of the received color target reference signals described further below, in which the luminance value, denoted Y, has been segregated from the correlated color temperature value, denoted x, y. The above has been described in relation to the CIE 1931 color space, however this is not meant to be limiting in any way. Use of other color spaces, including but not limited to the CIE LUV color space, and the CIE LAB color space are specifically incorporated herewith. Thus, optical sampling and control element 200 is in optical communication with the luminaire constituted of LED strings 40 and outputs a signal representative thereof consonant with target reference signals described below.

Difference generator 100 is arranged to receive a plurality of color target reference signals denoted respectively $x_{ref}$, $y_{ref}$ and the set of $x_{sampled}$, $y_{sampled}$ and output a plurality of error signals denoted respectively $error_1$ and $error_2$ reflective of any difference thereof. Feedback controller 220 is arranged to receive $error_1 error_2$ and output a plurality of PWM control signals denoted respectively $x_{set}$, $y_{set}$ to control the duty cycle of the respective PWM signals of PWM generator 230 in cooperation with a received luminance signal, $Y_{frame}$. PWM generator 230 is arranged to receive $x_{set}$, $y_{set}$ and luminance signal $Y_{frame}$ and in response output $r_{pwm}$, $g_{pwm}$ and $b_{pwm}$ responsive thereto, exhibiting the appropriate color and luminance levels. LED strings 40 may be replaced with red, green and blue LEDs without exceeding the scope of the invention.

Each of feedback controller 220, LED driver 30 and, as indicated above, A/D converter 70, receives a respective output of synchronizer 120. Feedback controller 220 is typically implemented as a PID controller requiring a plurality of steps to settle at the revised value. Synchronizer 120 is operative to: enable LED driver 30, responsive to a received Sync signal, during the appropriate portion of the frame; allow for propagation of the output of LED driver 30 through LED strings 40, RGB color sensor 50 and LPF 60 prior to sampling the output of LPF 60 by A/D converter 70; allow for settling of the output of A/D converter 70 with the sampled output of LPF 60, propagation through calibration matrix and converter 210 and propagation through difference generator 100; and step feedback controller 220 with resultant sampled output of LED strings 40. Thus, synchronizer 120 controls A/D converter 70 and feedback controller 220 to ensure that the change in luminance of LED strings 40 responsive to the received luminance setting input at PWM generator 230 impacts the input of feedback controller 220 prior to stepping feedback controller 220. Optionally, synchronizer 120 is further in communication with PWM generator 20 so as to be in synchronization with the cycle start time of $r_{pwm}$, $g_{pwm}$ and $b_{pwm}$.

Transfer function converter 130 is operative to compensate for any non-linearity in the response of LED strings 40 to a change in PWM setting. Thus, in the event of a purely linear response of luminance to a dimming or boosting factor, transfer function converter 130 acts as a pass through. In the event of any non-linearity, transfer function converter 130 acts to provide the PWM to luminance transfer function, which in one embodiment is stored in a look up table, and in another embodiment is implemented as a direct transfer function.

In operation, a host system, or a non-volatile memory, set at an initial calibration, outputs $x_{ref}$ and $y_{ref}$, thereby setting the desired white point, or other correlated color temperature of LED strings 40. Luminance setting input signal, $Y_{frame}$, preferably responsive to a video processor on a frame by frame basis, is operative to set the overall luminance on a frame by frame basis without affecting the desired white point or other correlated color temperature setting by directly inputting the luminance setting input to PWM generator 230. The color loop of FIG. 5, does not close a luminance loop, since $Y_{sampled}$ is not compared to $Y_{frame}$, and thus over time the luminance may drift as a consequence of aging. The luminance setting input signal $Y_{frame}$ is preferably further responsive to a user input, preferably as an input to the video processor, or by scaling the output of the video processor without exceeding the scope of the invention. Thus, the user closes a feedback loop of the luminance by adjusting the luminance user input. It is to be noted that the effect of the luminance setting input is thus immediate, and is irrespective of the action of the slow acting color loop.

The color loop is impervious to the luminance setting signal value, since all luminance information is segregated into $Y_{frame}$. Difference generator 100 compares $x_{ref}$ and $y_{ref}$ respectively with $x_{sampled}$ and $y_{sampled}$, and outputs error signals $error_1$ and $error_2$ reflective of the respective difference thereof. Feedback controller 220 is operative in cooperation with PWM generator 230, RGB color sensor 50 and calibration matrix and converter 210 to close the color loop thereby maintaining the light output by LED strings 40 consonant with color target reference signals $x_{ref}$ and $y_{ref}$. Synchronizer 120, as described above, acts to enable LED driver 30 during the appropriate portion of the frame, clock A/D converter 70 so as to sample the optical output during the active portion of the frame, and step feedback controller 220 responsive to the clocked sample optical output. Preferably, synchronizer 120 is in communication with PWM generator 20 to ensure synchronization with the PWM cycle generator therein.

In one embodiment, A/D converter 70 samples the optical output each PWM cycle of PWM controller 20 when LED driver 30 is enabled, responsive to synchronizer 120. Sampling only when LED driver 30 is enabled releases computing resources for use by other channels and reduces noise. In another embodiment, as will be described further hereinto below in relation to FIGS. 7-9, LPF 60 is replaced with an integrator arranged to present the overall energy of the PWM cycle to A/D converter 70.

Thus, the arrangement of FIG. 5 enables immediate luminance setting responsive to the luminance setting input signal, without affecting the slow acting color loop. Integrated optical sampling, control and generator element 250 provides a complete color manager and control system with a minimum of external components, while providing immediate response to luminance settings per frame.

The above embodiment has been explained in reference to an embodiment in which LEDs 40 are driven by a PWM signal, whose duty cycle is controlled so as to accomplish both dimming or boosting and control of the color correlated temperature, however this is not meant to be limiting in any way. In another embodiment LEDs 40 are adjusted by one or more of a resonance controller and amplitude modulation to control at least one of dimming or boosting and the color correlated temperature without exceeding the scope of the invention.

Figure 6:
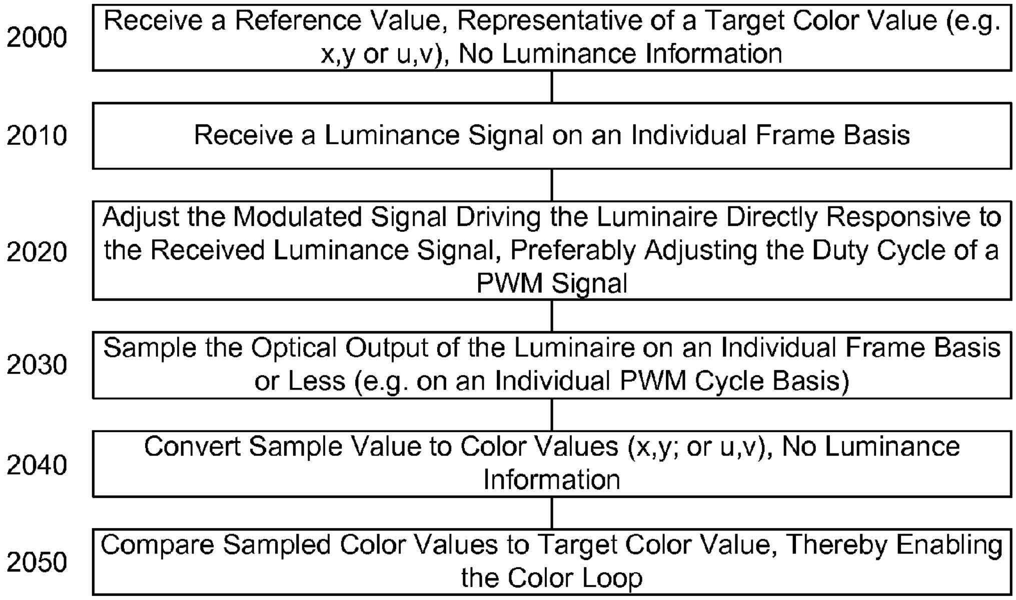
FIG. 6 illustrates a high level flow chart of a method according to a principle of the invention to enable color control by a slow color loop and per frame luminance setting in cooperation with the embodiment of FIG. 5.

FIG. 6 illustrates a high level flow chart of a method according to a principle of the invention to enable color control by a slow color loop and per frame luminance setting in cooperation with the embodiment of FIG. 5. In stage 2000, a reference color value is received, the received reference color value being representative of a target color correlated temperature without luminance information, such as an x,y value or an a,b value, without limitation. In one embodiment the received reference color value represents a white point.

In stage 2010, a luminance setting input signal is received, also known as a frame luminance value, such as a Y or L value, the received luminance setting signal defining the desired luminance of the backlight, or a particular zone of the backlight, on an individual frame basis. The luminance setting signal may be a dimming signal or a boosting signal in reference to a base value without exceeding the scope of the invention. Thus, the reference value of stage 2000 is invariant between frames, while the luminance frame luminance value signal of stage 2010 is variable on a frame by frame basis. There is no requirement that the luminance setting signal of stage 2010 be varied for each frame, and a plurality of contiguous frames exhibiting an unchanged luminance setting may be exhibited without exceeding the scope of the invention. There is no requirement that that reference values of stage 2000 be permanently fixed, and changes to the reference values of stage 2000 may occur, albeit preferably not on a frame by frame basis, without exceeding the scope of the invention.

In stage 2020, the modulated signal driving a luminaire is adjusted directly responsive to the received luminance setting signal of stage 1010. The term directly responsive as used herein, is meant to indicate that the luminance of the luminaire is adjusted responsive to the changed luminance setting signal as opposed to luminance change occurring primarily through action of the slow color loop as described in relation to FIG. 1 above. Preferably, the modulated signal is a PWM signal, and the adjustment of the modulated signal comprises adjusting the duty cycle of at least one PWM signal driving LEDs 40.

In stage 2030, the optical output of the luminaire driven by the modulated signal of stage 2020 is sampled on an individual frame basis, or less than an individual frame basis. In one embodiment, LPF 60 of FIG. 5 is designed so as to output an average luminance over a lighting portion of a frame, and synchronizer 120 is operative to sample the output of LPF 60 via A/D converter 70 so as to output a sample representative of the average luminance of the lighting portion of the frame. In another embodiment, A/D converter 70 samples the optical output each PWM cycle of PWM controller 20 when LED driver 30 is enabled, responsive to synchronizer 120. Preferably, in such an embodiment LPF 60 is replaced with an integrator arranged to present the overall energy of the PWM cycle to A/D converter 70.

In stage 2040, the sampled optical output is converted to a calorimetric system consonant with the input reference values of stage 2000. Luminance information is optionally discarded. In stage 2050, the converter value is compared with the reference value, and a difference generated thereby enabling the slow color loop. Luminance values are not fed back, and thus operate on an open loop orthogonal to the closed color loop.

FIG. 7 illustrates a high level block diagram of an embodiment of a optical sampling and control element 300, in accordance with a principle of the current invention, in which the output of an RGB color sensor 50 exhibiting a tristimulus output is integrated prior to sampling and digitizing. Optical sampling and control element 300 comprises: an RGB color sensor 50; a sampler 315 comprising an integrator 310 and an A/D converter 70; a calibration matrix 320; and synchronizer 120. Preferably, the input of A/D converter 70 comprises sample and hold circuitry. In one embodiment calibration matrix 320 is identical in all respects to calibration matrix 80 of FIGS. 2, 3 and in another embodiment (not shown) calibration matrix 320 is identical in all respects to calibration matrix and converter 210 of FIG. 5.

RGB color sensor 50 is in optical communication with the output of the luminaire constituted of the plurality of LED strings 40 of any of FIGS. 2, 3 and 5, and is operative to output a plurality of signals reflective thereof. Synchronizer 120 exhibits a first output connected to the clear input of integrator 310 and a second output connected to the sampling input of A/D converter 70. Integrator 310 is arranged to receive the output of RGB color sensor 50 and integrate the energy over a period. In one embodiment, integrator 310 is arranged to integrate the energy over a single PWM cycle, and is preferably implemented by an analog integrator. Advantageously, integrating over a PWM cycle takes account of small amplitude changes whose energy accumulates over the duty cycle but which are too small to be discriminated by A/D converter 70. In another embodiment integrator 310 is arranged to integrate the energy over a plurality of PWM cycles. A/D converter 70 is arranged to receive the output of integrator 310 and output a plurality of sampled and digitized signals thereof denoted respectively, $R_{sampled}$, $G_{sampled}$ and $B_{sampled}$, the sampling and digitizing being responsive to synchronizer 120. Synchronizer 120, after enabling the sampling and digitizing of A/D converter 70, and after an appropriate propagation and/or sampling delay, clears integrator 310 prior to the beginning of the subsequent period. Thus, the combination of integrator 310 and A/D converter 70 act as a sampler to sample the output of RGB color sensor 50.

Calibration matrix 320 is arranged to receive $R_{sampled}$, $G_{sampled}$ and $B_{sampled}$ and output a plurality of calibration converted sampled signals denoted respectively $X_{sampled}$, $Y_{sampled}$ and $Z_{sampled}$. Calibration matrix 320 converts $R_{sampled}$, $G_{sampled}$ and $B_{sampled}$ to a calorimetric system consonant with calorimetric system of received color target reference signals as described above in relation to FIGS. 2-6. Thus, optical sampling and control element 300 is in optical communication with LED strings 40 and outputs a signal representative thereof consonant with received target reference signals. Optical sampling and control element 300 has been described as comprising synchronizer 120 and calibration matrix 320, however this is not meant to be limiting in any way. In another embodiment either or both of synchronizer 120 and calibration matrix 320 are not part of optical sampling and control element 300 without exceeding the scope of the invention.

FIG. 8 illustrates a high level block diagram of an embodiment of an optical sampling and control element 350 in accordance with a principle of the current invention, in which the output of an RGB color sensor 50 is sampled, digitizing and then integrated. Optical sampling and control element 350 comprises: an RGB color sensor 50; a sampler 365 comprising an A/D converter 70 and a digital integrator 360; a calibration matrix 320; and a synchronizer 120. Preferably, the input of A/D converter 70 comprises sample and hold circuitry. In one embodiment, calibration matrix 320 is identical in all respects to calibration matrix 80 of FIGS. 2, 3 and in another embodiment (not shown) calibration matrix 320 is identical in all respects to calibration matrix and converter 210 of FIG. 5.

RGB color sensor 50 is in optical communication with the output of the luminaire constituted of the plurality of LED strings 40 of any of FIGS. 2, 3 and 5, and is operative to output a plurality of signals reflective thereof. Synchronizer 120 exhibits an output connected to the stepping input of integrator 360 and to the sampling input of A/D converter 70. A/D converter 70 is arranged to receive the output of RGB color sensor 50 and periodically sample the output of RGB color sensor 50. In one embodiment, A/D converter 70 samples at a minimum of twice the rate equivalent to the smallest step size of PWM generator 20 of FIGS. 2, 3 and 5. In another embodiment A/D converter 70 samples at less than twice the rate equivalent to the smallest step size of PWM generator 20. In such an embodiment, integrator 360 is arranged to integrate over a plurality of PWM cycles, and A/D converter 70 is arranged to sample adjacent PWM cycles at a time offset. The output of PWM generator 20 is repetitive over a particular frame, and thus by using an offset for sampling of adjacent cycles an effective increase in sampling rate is achieved. Integrator 360 is arranged to received the output of A/D converter 70, sum the values over a period and normalize the result to the desired accuracy. In one embodiment integrator 360 is arranged to thus digitally integrate the energy over a plurality of PWM cycles. Sampler 365, and particularly integrator 360, thus outputs a plurality of sampled and digitized signals thereof denoted respectively, $R_{sampled}$, $G_{sampled}$ and $B_{sampled}$, the sampling and digitizing being responsive to synchronizer 120.

Calibration matrix 320 is arranged to receive $R_{sampled}$, $G_{sampled}$ and $B_{sampled}$ and output a plurality of calibration converted sampled signals denoted respectively $X_{sampled}$, $Y_{sampled}$ and $Z_{sampled}$. Calibration matrix 320 converts $R_{sampled}$, $G_{sampled}$ and $B_{sampled}$ to a colorimetric system consonant with the received color target reference signals as described above in relation to FIGS. 2-6. Thus, optical sampling and control element 350 is in optical communication with LED strings 40 and outputs a signal representative thereof consonant with received target reference signals. Optical sampling and control element 350 has been described as comprising synchronizer 120 and calibration matrix 320, however this is not meant to be limiting in any way. In another embodiment either or both of synchronizer 120 and calibration matrix 320 are not part of optical sampling and control element 350 without exceeding the scope of the invention.

FIG. 9 illustrates a high level flow chart of a method according to a principle of the invention to enable color control by a slow color loop and per frame luminance control in cooperation with the embodiments of FIG. 2 or FIG. 3 utilizing the optical sampler of FIG. 7 or FIG. 8. In stage 3000, a color reference value is received, the received color reference value being representative of a target color correlated temperature and base luminance. In one embodiment the received reference value represents a white point.

In stage 3010, a luminance setting input signal is received, the received luminance setting signal defining the desired luminance of the backlight, or a particular zone of the backlight, on an individual frame basis. The luminance setting signal may be a dimming signal or a boosting signal without exceeding the scope of the invention. Thus, the reference value of stage 3000 is invariant between frames, while the luminance setting signal of stage 3010 is variable on a frame by frame basis. There is no requirement that the luminance setting signal be varied for each frame, and a plurality of contiguous frames exhibiting an unchanged luminance setting may be exhibited without exceeding the scope of the invention. There is no requirement that that reference values of stage 3000 be permanently fixed, and changes to the reference values of stage 3000 may occur, albeit preferably not on a frame by frame basis, without exceeding the scope of the invention.

In stage 3020, the modulated signal driving a luminaire is adjusted directly responsive to the received luminance setting signal of stage 3010. The term directly responsive as used herein, is meant to indicate that the luminance of the luminaire is adjusted responsive to the changed luminance setting signal as opposed to luminance change occurring primarily through action of the slow color loop as described in relation to FIG. 1 above. Preferably, the modulated signal is a PWM signal, and the adjustment of the modulated signal comprises adjusting the duty cycle of at least one PWM signal driving LEDs 40.

In stage 3030, the optical output of the luminaire driven by the modulated signal of stage 3020 is sampled and integrated over one of an individual PWM cycle basis and a plurality of PWM cycles, as described above respectively in relation to integrator 310, 360.

In stage 3040, one of the sampled output of stage 3030 and the received reference of stage 3000 is scaled by the value of the received luminance setting signal of stage 3010 so as to be consonant with the other. The error signals output by difference generator 100 of FIGS. 2, 3 are thus independent of the luminance value set by the received luminance setting signal of stage 3010, and the slow color loop comprising feedback controller 110 is thus enabled irrespective of the changing luminance setting signal on a per frame basis. In stage 3050, the scaled value is compared with the non-scaled value, and a difference generated thereby enabling the slow color loop. In the event of an embodiment in accordance with the implementation of FIG. 2, the scaled reference value set is compared with non-scaled sampled set. In the event of an embodiment in accordance with the implementation of FIG. 3, the non-scaled reference value set is compared with scaled sampled set.

The method of FIG. 9 is fully applicable to the embodiment of FIG. 5, with minor or no changes as will be understood by those skilled in the art.

Figure 10:
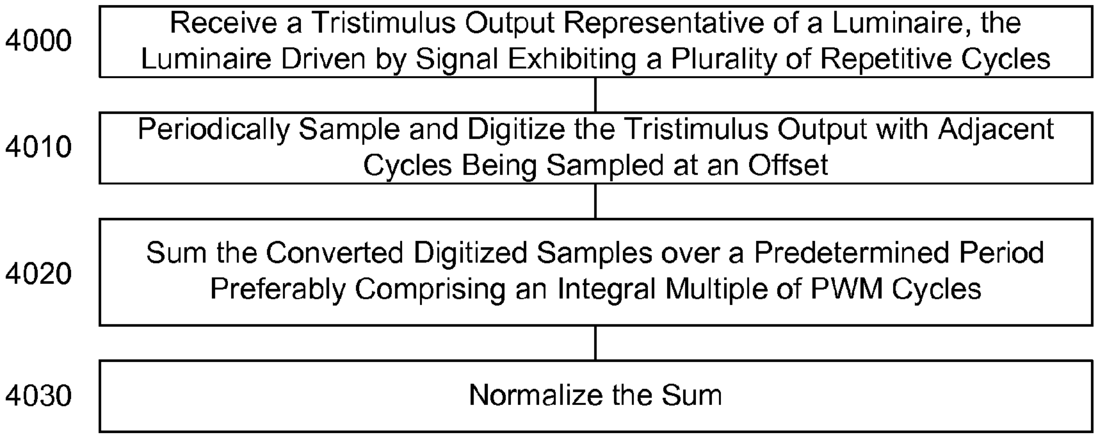
FIG. 10 illustrates a high level flow chart of a method according to a principle of the invention to effectively increase the sampling rate by sampling adjacent cycles at an offset.

FIG. 10 illustrates a high level flow chart of a method according to a principle of the invention to effectively increase the sampling rate by sampling adjacent cycles at an offset as described above in relation to sampler 365 of FIG. 8. In stage 4000, a tristimulus output is received from RGB color sensor 50 representative of the light output by a luminaire, such as LED strings 40 of FIGS. 2, 3 and 5. The luminaire is driven by a signal exhibiting a plurality of repetitive cycles, such as by a PWM signal.

In stage 3010, the output of RGB color sensor is periodically sampled and digitized, preferably by A/D converter 70. In an exemplary embodiment A/D converter 70 comprises a sample and hold at the input thereof. A/D converter 70 samples at a particular rate and a particular timing in relation to the beginning of the PWM cycle of PWM generator 20. Adjacent cycles are sampled at an offset from each other, thereby effectively increasing the sampling rate. In one embodiment, adjacent cycles are sampled at an offset of ½ the sampling rate time difference, thereby effectively doubling the sampling rate. In another embodiment a minimum of 4 active PWM cycles are exhibited per frame, and an offset of ¼ the sampling rate time difference is utilized for each cycle thereby effectively quadrupling the sampling rate.

In stage 4020, the samples of stage 4010 are summed over a predetermined period, preferably consisted of an integer multiple of PWM cycles. It is to be understood that there is no need for samples to be taken during PWM cycles when LED driver 30 is disabled or inactive. Thus, during portions of the frame when LED strings 40 are not illuminated no samples are taken.

In stage 4030, the sum of stage 4020 is normalized. In one embodiment the sum is divided by the number of samples. In another embodiment the sum is normalized to the required accuracy.

Thus, certain embodiments enable an optical sampling and control element in which a portion of the light from a luminaire is received at a color sensor, which outputs electrical signals responsive to particular ranges of wavelengths of the received light. The outputs of the color sensor are integrated over a predetermined period. In one embodiment the outputs of the color sensor are integrated over each active PWM cycle of the luminaire. In another embodiment the outputs of the color sensor are integrated over a plurality of active PWM cycles of the luminaire.

In one embodiment the integrator is an analog integrator, whose output is digitized by an analog to digital converter. In another embodiment the integrator is a digital integrator arranged to integrate digitized samples of the color sensor outputs. In one further embodiment, the digitizer is arranged to digitize samples of adjacent cycles of the source luminaire at an offset, thus resulting in an effective increase in sampling rate. The digitized samples are summed and normalized to the required accuracy.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description and which are not in the prior art.

We claim:

1. An optical sampling and control element for use with a luminaire exhibiting a cycle and a frame, the optical sampling and control element comprising:

a color sensor in optical communication with the luminaire;

a synchronizer; and a sampler connected to the outputs of said color sensor, said sampler comprising:

an integrator; and an analog to digital converter in communication with said color sensor, said analog to digital converter arranged to sample said color sensor, responsive to said synchronizer, at a plurality of adjacent cycles of said luminaire during a single frame, each of said plurality of adjacent cycles sampled at an offset from the previous cycle, and said integrator arranged to sum the converted outputs of said analog to digital converter over a predetermined period less than the frame and normalize said sum.

2. An optical sampling and control element according to claim 1, further comprising a color manager arranged to receive the output of said sampler.

3. An optical sampling and control element according to claim 2, wherein said color manager comprises a pulse width modulation signal generator.

4. An optical sampling and control element according to claim 2, further comprising a light emitting diode driver arranged to receive the output of said color manager.

5. An optical sampling and control element according to claim 1, further comprising a color manager arranged to receive the output of said sampler, and wherein said color manager comprises:

a means for receiving a luminance setting input signal defining a luminance, on an individual frame basis, of the luminaire;

a means for receiving a color reference value;

a feedback controller requiring a plurality of frames to converge;

a modulated signal generator immediately responsive to said received luminance setting input signal and said feedback controller;

a scaler arranged to scale a first one of said received reference value and said output signal of said sampler, to be consonant with a second one of said received reference value and said output signal of said sampler; and a difference circuit, arranged to output a signal representative of the difference between the output of said scaler and the output of said second one of said received reference value and said output signal of said sampler, said feedback controller responsive to said output signal of said difference circuit to reduce said difference.

6. A method of optical sampling and control for use with a luminaire exhibiting a cycle and a frame, the method comprising:

receiving a tristimulus output representative of the luminaire;

periodically sampling said received tristimulus output at a predetermined period so as to sample said received tristimulus output at a plurality of adjacent cycles of said luminaire during a single frame, wherein said periodically sampling of each of said plurality of adjacent cycles is at an offset from the previous cycle;

digitizing each of said periodic samples to a digital representation; and integrating said received tristimulus output over a predetermined period comprising at least one cycle and less than one frame by summing said digitized periodic samples over the predetermined period and normalizing said sum.

7. A method according to claim 6, further comprising controlling a color loop responsive to said integrated tristimulus output.

8. A method according to claim 7, further comprising generating a pulse width modulation signal responsive to said controlled color loop.

9. A method according to claim 8, further comprising driving said luminaire responsive to said generated pulse width modulation signal.

10. A method according to claim 6, further comprising:

receiving a luminance setting input signal defining the luminance of the luminaire on an individual frame basis;

receiving a color reference value;

scaling a first one of said received reference value and said integrated tristimulus output, to be consonant with a second one of said received reference value and said integrated tristimulus output; and calculating a difference between said first one of said received reference value and said integrated tristimulus output, and said second one of said received reference value and said integrated tristimulus output.

* * * * *